United States Patent
Hoshikawa et al.

(10) Patent No.: US 9,776,221 B2
(45) Date of Patent: Oct. 3, 2017

(54) METHOD FOR MANAGING AND DEVICE FOR MANAGING NOZZLE CLEANING PERIOD

(71) Applicant: FUJI MACHINE MFG. CO., LTD., Chiryu (JP)

(72) Inventors: Kazumi Hoshikawa, Chiryu (JP); Yoshiyuki Honda, Chiryu (JP); Nobuhisa Komiyama, Chiryu (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 105 days.

(21) Appl. No.: 14/903,529

(22) PCT Filed: Jul. 10, 2013

(86) PCT No.: PCT/JP2013/068922
§ 371 (c)(1),
(2) Date: Jan. 7, 2016

(87) PCT Pub. No.: WO2015/004760
PCT Pub. Date: Jan. 15, 2015

(65) Prior Publication Data
US 2016/0158812 A1 Jun. 9, 2016

(51) Int. Cl.
*B08B 9/02* (2006.01)
*H05K 13/04* (2006.01)

(52) U.S. Cl.
CPC ........... *B08B 9/02* (2013.01); *H05K 13/0408* (2013.01); *Y10T 137/0419* (2015.04); *Y10T 137/4245* (2015.04)

(58) Field of Classification Search
CPC ......... Y10T 137/0419; Y10T 137/4245; Y10T 137/7761; Y10T 137/86397;
(Continued)

(56) References Cited

U.S. PATENT DOCUMENTS 5,647,386 A * 7/1997 Kaiser ................. B08B 3/00
134/111
5,742,396 A * 4/1998 Kazem-Goudarzi .. B65G 47/91
250/227.14

(Continued)

FOREIGN PATENT DOCUMENTS

JP 2012-5948 A 1/2012

OTHER PUBLICATIONS

International Search Report Issued Sep. 10, 2013 in PCT/JP13/068922 Filed Jul. 10, 2013.

*Primary Examiner* — Matthew W Jellett
(74) *Attorney, Agent, or Firm* — Oblon, McClelland, Maier & Neustadt, L.L.P.

(57) ABSTRACT

A nozzle cleaning period management device is provided with a cleaning device that cleans suction nozzles that are used in order to perform vacuum retention of an electronic component, a flow rate measurement device for measuring a flow rate that flows through the suction nozzles, a reduction amount calculation device for calculating a unit flow rate reduction amount of the flow rate of the suction nozzle per a number of times of mounting of electronic components on the basis of a flow rate difference before and after cleaning, which is measured by the flow rate measurement device, and an estimation device for estimating a cleaning period, which subsequently cleans the suction nozzles, on the basis of the unit flow rate reduction amount, which is calculated by the reduction amount calculation device, and a flow rate after cleaning.

6 Claims, 5 Drawing Sheets

(58) Field of Classification Search
CPC ............. Y10T 137/86389; G01F 11/24; G01F 25/092; B67D 1/1243; H05K 13/04; H05K 13/0408; H01L 21/67051; B08B 9/02; B08B 9/027; B08B 9/0321; B08B 3/12
USPC .................. 137/238, 487.5, 624.11, 624.12; 700/282, 283; 222/71; 73/865.9; 134/22.18, 30
See application file for complete search history.

(56) References Cited

U.S. PATENT DOCUMENTS

| | | | |
|---|---|---|---|
| 6,948,512 B2* | 9/2005 | McKeague | E03B 9/04 134/168 C |
| 8,777,695 B2* | 7/2014 | Sato | B08B 3/12 134/1 |
| 9,372,036 B2* | 6/2016 | Pearson | B60H 1/3233 |
| 2006/0053624 A1* | 3/2006 | Maeda | H05K 13/0408 29/832 |
| 2006/0260638 A1* | 11/2006 | Fani | H01L 21/67051 134/1 |
| 2006/0260639 A1* | 11/2006 | Fani | H01L 21/67051 134/1 |
| 2007/0197138 A1* | 8/2007 | Montierth | A61B 8/546 451/36 |
| 2015/0343546 A1* | 12/2015 | Herz | B08B 3/12 134/1 |
| 2016/0120081 A1* | 4/2016 | Hosaka | H05K 13/0408 700/283 |

* cited by examiner

METHOD FOR MANAGING AND DEVICE FOR MANAGING NOZZLE CLEANING PERIOD

TECHNICAL FIELD

The present disclosure relates to a nozzle cleaning period management device and a nozzle cleaning period management method, which manage a cleaning period of suction nozzles that are used in order to perform vacuum retention of an electronic component.

BACKGROUND ART

Suction nozzles that mount electronic components onto circuit boards by performing vacuum retention of the electronic components, are provided in mounting heads of component mounting machines. In such component mounting machines, foreign matter such as dust and solder is suctioned into suction nozzles when an electronic component is vacuumed by the suction nozzles. Therefore, if the suction nozzles are continuously used for long periods of time, foreign matter such as dust and solder becomes attached to inner portion pathway of the suction nozzles. As a result of this, since a suctioning force of the suction nozzles is gradually reduced, periodic cleaning of the suction nozzles is necessary.

As a cleaning device of suction nozzles, the device disclosed in PTL 1 is known. The device disclosed in PTL 1 cleans using an ultrasonic wave washing process by detaching suction nozzles from the mounting head.

CITATION LIST

Patent Literature

PTL 1: JP-A-2012-5948

SUMMARY

Problem to be Solved

Incidentally, in such a cleaning device, it is common to perform cleaning of suction nozzles every predetermined time period, which has been established empirically, or every predetermined number of times of mounting of components. However, the setting of the cleaning period is considerably difficult, and furthermore, it is necessary perform setting for each plurality of suction nozzles.

Accordingly, conventionally, by the cleaning interval being set too long, the vacuuming force of the suction nozzles is reduced, leading to vacuuming faults; and by the cleaning interval being set shorter to prevent this, cleaning is performed unnecessarily despite the fact that the performance of the suction nozzles is sufficient, resulting in a decrease in the component mounting efficiency due to the excessive cleaning time.

The present disclosure was devised in order to solve the abovementioned technical problem, and an object thereof is to provide a nozzle cleaning period management device and management method that are configured so as to be capable of indicating a suitable cleaning period of suction nozzles.

Means for Solving the Problem

In order to solve the abovementioned technical problem, a feature of the disclosure according to an aspect resides in a nozzle cleaning period management device that is provided with a cleaning device that cleans suction nozzles that are used in order to perform vacuum retention of an electronic component, a flow rate measurement device for measuring a flow rate that flows through the suction nozzles, a reduction amount calculation device for calculating a unit flow rate reduction amount of the flow rate of the suction nozzle per a number of times of mounting of electronic components on the basis of a flow rate difference before and after cleaning, which is measured by the flow rate measurement device; and an estimation device for estimating a cleaning period, which subsequently cleans the suction nozzles, on the basis of a unit flow rate reduction amount, which is calculated by the reduction amount calculation device, and a flow rate after cleaning.

According to the disclosure as the aspect, since it is possible to estimate the cleaning period of the suction nozzles using the estimation device, it is possible to cut down on a surplus cleaning workload while maintaining suction nozzle performance, and therefore, it is possible to contribute to an improvement in product quality and an increase in the efficiency of component mounting work.

A feature of the disclosure according to another aspect resides in the nozzle cleaning period management device according to claim 1, in which the estimation device estimates a subsequent cleaning period by subtracting a use limit value flow rate from a flow rate after cleaning, and dividing a subtracted value by the unit flow rate reduction amount.

According to the disclosure as in the aspect, since it is possible to estimate a subsequent cleaning period by taking into account the unit flow rate reduction amount as result information from the flow rate after cleaning and the use limit value flow rate, it is possible to suitably estimate a cleaning period that matches the suction nozzles.

A feature of the disclosure according to another aspect resides in the nozzle cleaning period management device, in which an identification code, which is read by a code reading device, is applied to outer surfaces of the suction nozzles, and in which the cleaning device is configured to also clean the outer surface of the suction nozzles.

According to the disclosure as in the aspect, as a result of also cleaning the outer surfaces of suction nozzles 12, it is possible to simultaneously remove dust and the like that is attached to the identification code that is provided on the suction nozzles, and therefore, it is possible to suppress faults such as image processing errors when reading the identification code using the code reading device.

A feature of the disclosure according to another aspect resides in the nozzle cleaning period management device according to claim 3, in which the subsequent cleaning period that is estimated by the estimation device is stored for each identification code of the suction nozzles.

According to the disclosure as in the aspect, since the cleaning period is configured to be stored for each identification code of the suction nozzles, it is possible to clean each suction nozzle with a cleaning period that is respectively suitable for each of a plurality of suction nozzles.

A feature of the disclosure according to another aspect resides in a nozzle cleaning period management method that reads an identification code that is applied to suction nozzles, measures a flow rate that flows through the suction nozzles before cleaning the suction nozzles, subsequently cleans the suction nozzles and measuring a flow rate that flows through the suction nozzles after cleaning, calculates a unit flow rate reduction amount of the flow rate per a number of times of mounting of electronic components on the basis of flow rates difference before and after cleaning, and estimates the cleaning period, which subsequently cleans the suction nozzles, on the basis of the unit flow rate reduction amount and the flow rate after cleaning.

According to the disclosure as in the aspect, since the cleaning period, which subsequently cleans the suction nozzles, is estimated on the basis of the unit flow rate reduction amount and the flow rate after cleaning, it is possible to cut down on a surplus cleaning workload while maintaining suction nozzle performance, and furthermore, it is possible to manage a cleaning period for each identification code of the suction nozzles.

A feature of the disclosure according to another aspect resides in the nozzle cleaning period management method according to claim 5, in which a subsequent cleaning period is estimated by subtracting a use limit value flow rate from a flow rate after cleaning, and dividing a subtracted value by the unit flow rate reduction amount for each identification code of the suction nozzles.

According to the disclosure as in the aspect, it is possible to suitably estimate a subsequent cleaning period by taking into account the unit flow rate reduction amount as result information from the flow rate after cleaning and the use limit value flow rate.

DESCRIPTION OF EMBODIMENTS

Figure 1:
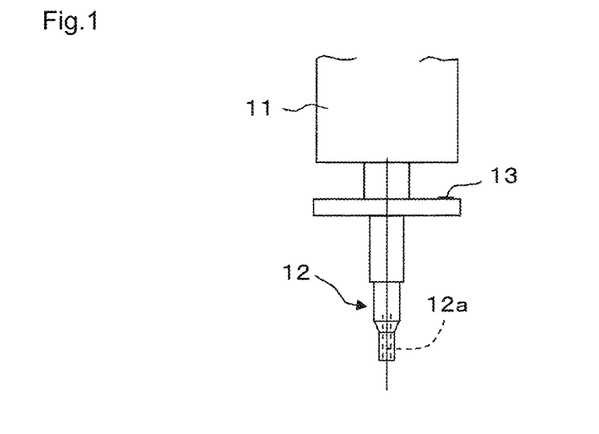
FIG. 1 is a view that shows a mounting head in which a suction nozzle according to an embodiment of the present disclosure is retained.

Hereinafter, an embodiment of the present disclosure will be described on the basis of the drawings. As shown in FIG. 1, a suction nozzle 12, which performs vacuum retention of an electronic component, is detachably mounted in a mounting head 11 of a component mounting machine 10 (refer to FIG. 2). An identification code 13, which is formed from a two-dimensional code or the like, is applied to the suction nozzle 12, and it is possible to acquire a serial ID of the suction nozzle 12 by reading the identification code 13 using a code reading device 22 that is formed from a camera of the like, which will be described later.

Figure 2:
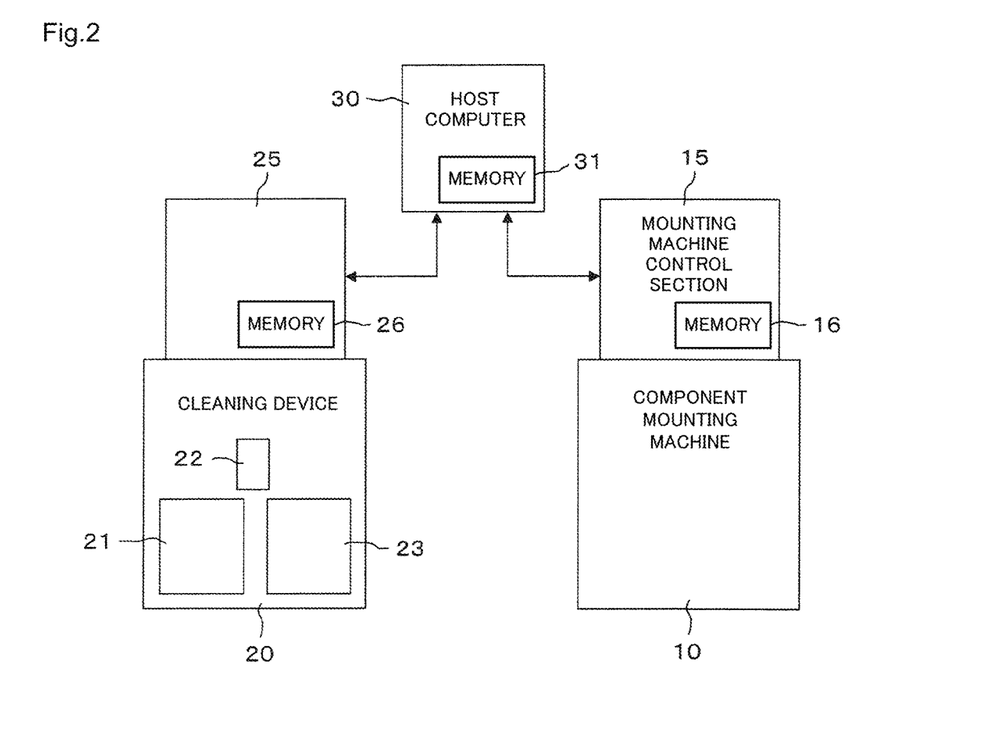
FIG. 2 is a view that shows a relationship between a component mounting machine and a cleaning device.

Additionally, although not illustrated in the drawings, a nozzle stocker, which holds a plurality of suction nozzles 12, is provided in the component mounting machine 10, and the suction nozzles 12 are switched between the nozzle stocker and the mounting head 11.

As shown in FIG. 2, a mounting machine control section 15 is provided in the component mounting machine 10, and a number of times of mounting N of mounting an electronic component is stored in a predetermined storage area of a memory 16 of the mounting machine control section 15 for the serial ID of each suction nozzle 12. The number of times of mounting N is reset to 0 when, as will be described later, the suction nozzle 12 is cleaned, and thereafter, the count is initiated again each time an electronic component is mounted onto a circuit board using the suction nozzle 12. In this manner, the number of times of mounting N is stored in the memory 16 from a time point at which each suction nozzle 12 is cleaned.

The cleaning device 20, which cleans the suction nozzle 12 is disposed spaced apart from the component mounting machine 10, and a washing machine 21, which cleans the suction nozzle 12, the code reading device 22, which reads the identification codes 13 that are applied to the suction nozzles 12, and a measurement device 23, which measures an unclean condition of the suction nozzle 12, are provided in the cleaning device 20.

The washing machine 21 removes foreign matter such as dust by cleaning an inner portion pathway 12a (refer to FIG. 1) and an outer surface of the suction nozzle 12. In addition, the measurement device 23 measures an unclean condition of the suction nozzle 12 before cleaning and a washed condition after cleaning by measuring a flow rate of air that flows through the inner portion pathway 12a of the suction nozzle 12.

A cleaning control section 25 is provided in the cleaning device 20, cleaning of the suction nozzle 12 and measurement of the flow rate are controlled by the cleaning control section 25, and a flow rate measurement value is stored in a predetermined storage area of memory 26 of the cleaning control section 25 for each suction nozzle 12.

A host computer 30 is connected to the mounting machine control section 15 and the cleaning control section 25, and a calculation program, which calculates a unit flow rate reduction amount per a number of times of mounting of electronic components, which will be described later, for each suction nozzle 12, an estimation program, which estimates a subsequent cleaning period of the suction nozzle 12, and the like are stored in a memory 31 of the host computer 30.

Figure 3:
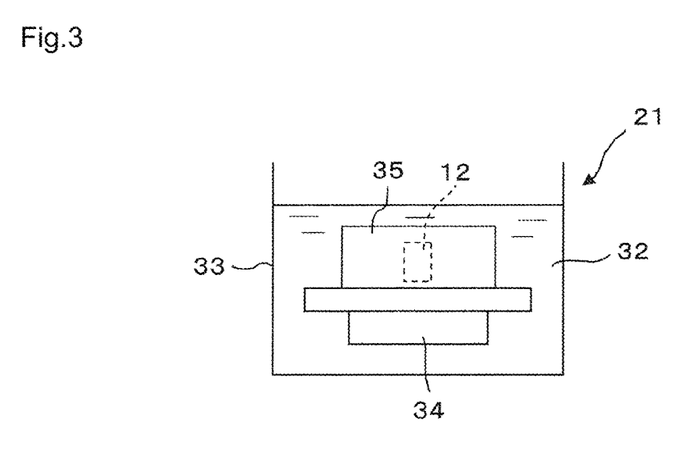
FIG. 3 is a view that shows an example that performs an ultrasonic wave washing process on the suction nozzles.

In the embodiment, as an example, the washing machine 21 is configured by an ultrasonic washing machine that is shown in FIG. 3, and the washing machine 21 is provided with a cleaning tub 33, which accommodates a cleaning liquid 32, an ultrasonic wave generator 34, which generates ultrasonic waves for performing an ultrasonic wave washing process on the suction nozzle 12, and a nozzle holding member 35, which holds the suction nozzle 12 in a state of being immersed in the cleaning liquid 32.

Figure 4:
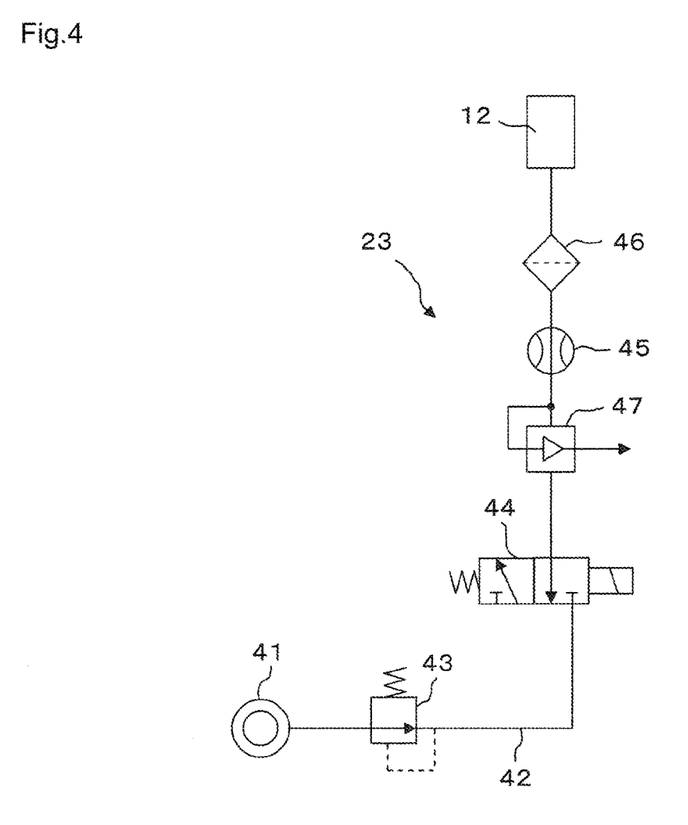
FIG. 4 is a view that shows an air circuit of a measurement device that measures an unclean condition and the like of the suction nozzles.

Next, an air circuit of the measurement device 23, which measures the flow rate that flows through the inner portion pathway 12a of the suction nozzle 12, will be described on the basis of FIG. 4. The air circuit is provided with an air pathway 42, which is connected to an air supply source (a compressor) 41, and air (pressurized air) that is supplied to the air pathway 42 is adjusted to a constant pressure by a regulator bulb 43, and ejected to the outside via a replacement bulb 44 by an ejector 47. The inner portion pathway 12a of the suction nozzle 12 is connected to the ejector 47 via a flow rate measurement sensor 45, as the flow rate measurement device, and a filter 46. Air is sucked in by a distal end of the suction nozzle 12 due to the ejector 47, and the air that is sucked in is emitted to the outside via the flow rate measurement sensor 45 by the ejector 47.

As a result of this, a flow rate that corresponds to a flow-through state of air that flows inside the suction nozzle 12, or in other words, a flow rate that corresponds to an unclean condition of the suction nozzle 12 before cleaning, and a flow rate that corresponds to a washed condition of the suction nozzle 12 after cleaning, are measured by the flow rate measurement sensor 45, and information of the measured flow rates is stored in the memory 26 of the cleaning control section 25.

Next, a sequence that cleans the suction nozzle 12 will be described. The cleaning of the suction nozzle 12 is implemented on the basis of a cleaning instruction that is generated as a result of mounting by the suction nozzle 12 for a number of times of mounting of electronic components that is estimated by a sequence that will be described later.

When a cleaning instruction is generated by the mounting machine control section 15, firstly, the suction nozzle 12 that should be cleaned is detached from the mounting head 11 of the component mounting machine 10, and carried to the cleaning device 20. In this case, by attaching the same kind of suction nozzle 12 from the nozzle stocker, which is provided in the component mounting machine 10 but not illustrated, to the mounting head 11, it is possible to operate the component mounting machine 10 without a stoppage regardless of the cleaning of the suction nozzle 12.

Subsequently, the suction nozzle 12 is immersed inside the cleaning tub 33 of the washing machine 21, and is held in the nozzle holding member 35. In this state, the ultrasonic wave generator 34 is activated, and an ultrasonic wave washing process is performed on the suction nozzle 12. As a result of this, foreign matter such as dust that has become attached to the interior portion of the suction nozzle 12, is removed, and dust, and the like, that has become attached to the outer surface of the suction nozzle 12 is removed.

When the ultrasonic wave washing process of the suction nozzle 12 is completed, the suction nozzle 12 is taken out of the cleaning tub 33, and dried by an air blower for drying, which is not illustrated. Subsequently, the suction nozzle 12 is mounted in the measurement device 23.

In this state, when a measurement initiation button, which is not illustrated, is manipulated, the replacement bulb 44 of the measurement device 23 is replaced, air is sucked in by the distal end of the suction nozzle 12 as a result of air that is supplied to the air pathway 42 from the air supply source 41 being ejected to the outside by the ejector 47, and air that is sucked in is discharged to the outside via the flow rate measurement sensor 45.

As a result of this, a flow rate that flows through the suction nozzle 12 after cleaning is measured by the flow rate measurement sensor 45, and information of the measured flow rate is stored in the memory 26 of the cleaning control section 25. In a case in which the information of the flow rate after cleaning that is stored in the memory 26 is compared with a threshold value (a pass value) that is registered in advance in the memory 26, and the measured flow rate exceeds the threshold value, that is, in a case in which dust and the like is removed as a result of cleaning the suction nozzle 12, and air flows through the suction nozzle 12 sufficiently, it is determined that washing with air has been performed favorably, and a pass is determined. Thereafter, the cleaned suction nozzle 12 is detached from the measurement device 23, and is returned to the component mounting machine 10.

Additionally, regardless of the fact that the suction nozzle 12 has been cleaned, in a case in which the fact that the washing has not been performed favorably is evident from the results of flow rate measurement or the like, it is possible to detect a defect of production equipment by sending a warning message. In addition, by checking a history of cleaning, it is possible to detect a performance reduction of the suction nozzle 12, and as a result of this, it is possible to determine the life span of the suction nozzle 12.

Hereinafter, a specific example that estimates the cleaning period of the suction nozzle 12 will be described, but before estimating the cleaning period, a unit flow rate reduction amount $\Delta Rd$ per a number of times of mounting of electronic components is calculated on the basis of result information for each suction nozzle 12, and stored in a predetermined storage area of the memory 26 of the cleaning control section 25. That is, an average value of how much the flow rate that flows through the suction nozzle 12 is reduced during the suction nozzle 12 mounting one electronic component is respectively calculated for each suction nozzle 12, and is stored.

Figure 6:
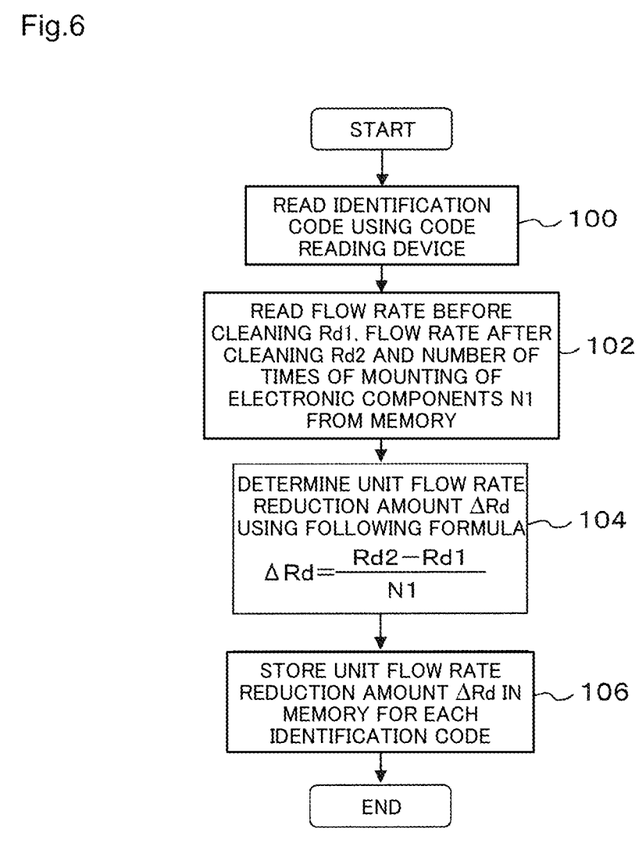
FIG. 6 is a flowchart that shows a sequence that calculates a unit flow rate reduction amount.

FIG. 6 shows a flowchart that the host computer 30, which calculates the unit flow rate reduction amount $\Delta Rd$ per a number of times of mounting of electronic components for each suction nozzle 12, executes. Firstly, in Step 100, the identification code 13 of each suction nozzle 12 that is carried to the cleaning device 20 is read by the code reading device 22 and a serial ID is acquired. Subsequently, in Step 102, a flow rate measurement value before cleaning Rd1 and a flow rate measurement value after cleaning Rd2 of the suction nozzle 12 of the serial ID that is read, and a number of times of mounting of electronic components N1 that is a number of times of mounting of electronic components by the suction nozzle 12 between before and after cleaning are respectively read from the memories 26 and 16 of the cleaning control section 25 and the mounting machine control section 15, and are transferred to the host computer 30.

Next, in Step 104, the unit flow rate reduction amount $\Delta Rd$ per a number of times of mounting of electronic components of each suction nozzle 12 is calculated on the basis of the following Formula 1.

Unit Flow Rate Reduction Amount $\Delta Rd$=Flow Rate After Cleaning $Rd2$-Flow Rate Before Cleaning $Rd1$/Number of Times of Mounting of Electronic Components by Suction Nozzle $N1$  [Formula 1]

In Formula 1, the measurement value Rd1 of the flow rate before cleaning is subtracted from the measurement value Rd2 of the flow rate after cleaning the suction nozzle 12, and the unit flow rate reduction amount $\Delta Rd$ of the flow rate that flows through the suction nozzle 12 that occurs when one electronic component is mounted is calculated for each suction nozzle 12 by dividing that value (Rd2−Rd1) by the number of times of mounting of electronic components N1 that an electronic component is mounted by the suction nozzle 12 in the period before and after cleaning. The unit flow rate reduction amount $\Delta Rd$ is stored in the memory 31 of the host computer 30 in Step 106.

Figure 5:
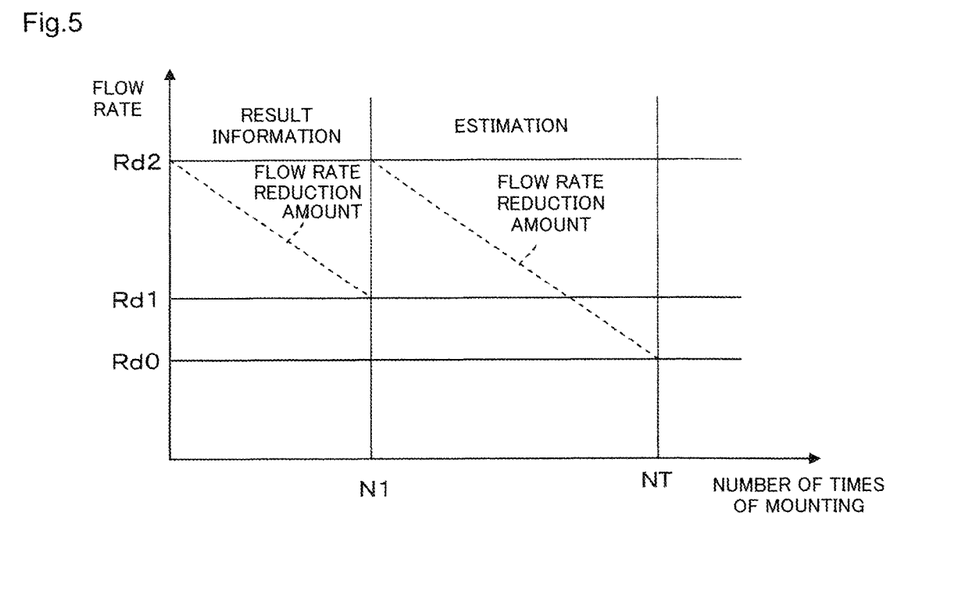
FIG. 5 is a diagram that shows a relationship between a number of times of mounting of electronic components and a flow rate that flows through the suction nozzles.

That is, as shown in FIG. 5, a tendency of the unclean condition (the unit flow rate reduction amount $\Delta Rd$) of the suction nozzle 12 is acquired as result information using the flow rate measurement value after cleaning Rd2, the flow rate measurement value before cleaning Rd1, and the number of times of mounting of electronic components N1 of the suction nozzle therebetween. The unit flow rate reduction amount $\Delta Rd$ forms a basis for estimating the cleaning period of the suction nozzle 12 that is described below.

The Reduction amount calculation device, which calculate the unit flow rate reduction amount $\Delta Rd$ of the flow rate of the suction nozzle 12 per a number of times of mounting of electronic components on the basis of a flow rate difference before and after cleaning, is configured by the above-mentioned Step 104.

Next, a flowchart that the host computer 30, which estimates the cleaning period for cleaning the suction nozzle 12, executes will be described on the basis of FIG. 7. Firstly, in Step 200, the cleaning of a given suction nozzle 12 has been completed in the cleaning device 20, and thereafter, the suction nozzle 12 is mounted in the measurement device 23, the identification code 13 of the suction nozzle 12 is read by the code reading device 22, and the serial ID is acquired. Subsequently, in Step 202, the unit flow rate reduction amount ΔRd of the suction nozzle 12 of the read serial ID, a use limit value flow rate Rd0, and the flow rate measurement value after cleaning Rd2 are respectively read from the memories 26 and 31 of the cleaning control section 25 and the host computer 30.

In this instance, the use limit value flow rate Rd0 is a flow rate that flows through the suction nozzle 12 in an unclean limit state that can perform a minimum maintenance of the performance of the suction nozzle 12, or in other words, a flow rate that flows through the suction nozzle 12 in an unclean limit state at which vacuum retention of an electronic component can be performed by the suction nozzle 12 without errors. The use limit value flow rate Rd0 is determined in advance for each of the plurality of suction nozzles 12 using experiments and the like, and is respectively stored in a predetermined storage area of the memory 26 of the cleaning control section 25. Additionally, 50% to 80% of the flow rate that flows through the suction nozzle 12 in a new state is suitably as the use limit value flow rate Rd0.

Next, in Step 204, an allowable number of times of mounting of electronic components NT of the suction nozzle 12 until the suction nozzle 12 is subsequently cleaned, that is, the subsequent cleaning period of the suction nozzle 12, is determined on the basis of the following Formula 2.

Subsequent Cleaning Period $NT$=Flow Rate After Cleaning $Rd2$−Use Limit Value Flow Rate $Rd0$/ Unit Flow Rate Reduction Amount $\Delta Rd$ [Formula 2]

In Formula 2, the use limit value flow rate Rd0 is subtracted from the flow rate measurement value Rd2 that is measured after cleaning, and the subsequent cleaning period of the suction nozzle 12 (the number of times of mounting of electronic components NT of the suction nozzle 12 until subsequent cleaning is determined by dividing that value (Rd2−Rd0) by the unit flow rate reduction amount ΔRd. The number of times of mounting of electronic components NT is transferred to the host computer 30 and stored in the memory 31 as a subsequent nozzle cleaning period in Step 206.

That is, as shown in FIG. 5, by taking into account the unit flow rate reduction amount ΔRd as result information from the flow rate measurement value after cleaning Rd1 and the use limit value flow rate Rd0, it is possible to infer the number of times of mounting of electronic components NT in which the suction nozzle 12 is capable of mounting a maximum number of electronic components, and store this as an estimated period for subsequently cleaning the suction nozzle 12.

The Estimation device, which estimate the cleaning period in which the suction nozzle 12 is subsequently cleaned on the basis of the unit flow rate reduction amount ΔRd and the flow rate after cleaning, is configured by the abovementioned Step 204.

In this manner, since the number of times of mounting of electronic components NT is respectively stored in the memory 31 of the host computer 30 as an estimated value of the subsequent cleaning period for each suction nozzle 12, the true number of times of mounting of electronic components is mounted of electronic components that have mounted by the suction nozzle 12 in a practical manner, and the number of times of mounting of electronic components NT that is stored in the memory of the host computer 30 are compared each time the suction nozzle 12 of each serial ID is mounted in the mounting head 11 of the component mounting machine 10 and an electronic component is mounted onto a circuit board, and a cleaning instruction is generated for the suction nozzle 12 when the true number times of mounting of electronic components reaches the number of times of mounting of electronic components NT.

Additionally, as a result of periodically performing measurement of the unit flow rate reduction amount ΔRd per a number of times of mounting of electronic components for each suction nozzle 12 and successively updating the unit flow rate reduction amount ΔRd, it is possible to perform more high-precision cleaning period estimation that corresponds to changes in the suction nozzle 12 over time.

In this manner, according to the present embodiment, since it is possible to suitably estimate the cleaning period of the suction nozzle 12 based on the result information of the suction nozzle 12, it is possible to cut down on a surplus cleaning workload, and it is possible to perform cleaning before the performance of the suction nozzle 12 drops. As a result of this, it is possible to cut down on a surplus workload of an operator while maintaining the performance of the suction nozzle, and therefore, it is possible to contribute to an improvement in product quality and the optimization of component mounting work.

Furthermore, since the cleaning period is configured to be stored for each identification code 13 of the suction nozzles 12, it is possible to estimate a cleaning period that is respectively suitable for each of the plurality of suction nozzles 12. In addition, since it is possible to manage the cleaning periods using the identification codes 13 that are applied to the suction nozzles 12, it is possible for a user to know the cleaning period of each suction nozzle 12 irrespective of the component mounting machine 10 to which the suction nozzle 12 is attached.

In addition, according to the present embodiment, since, as a result of also cleaning the outer surfaces as well as the inner portion of suction nozzles 12, it is possible to simultaneously remove dust and the like that is attached to the identification code 13 that is provided on the suction nozzles 12, and therefore, it is possible to suppress faults such as image processing errors when reading the identification code 13 using the code reading device 22.

In the abovementioned embodiment, an example in which the suction nozzle 12 is cleaned using an ultrasonic wave washing process was described, but the form of cleaning the suction nozzle 12 is not particularly limited, and for example, the mounting head 11, which holds the suction nozzle 12, may be mounted in a washing unit that is capable of performing high-pressure washing and flow rate measurement, and cleaning and the measurement of the flow rate may be performed in a batch.

In addition, in the abovementioned embodiment, an example in which a single suction nozzle 12 is provided in the mounting head 11 of the component mounting machine 10 was described, but it is also possible to apply the embodiment to a component mounting machine in which a plurality of suction nozzles 12 are provided in the mounting head 11, and in this case, it is also possible to eliminate the need for the nozzle stockers according to necessity.

In addition, in the abovementioned embodiment, an example in which a program that calculates the unit flow rate reduction amount ΔRd, and a program that estimates the cleaning period of the suction nozzle 12, are executed by the host computer 30 was described, but these programs may be performed by the cleaning control section 25 or the mounting machine control section 15.

In addition, in the abovementioned embodiment, an example in which the identification codes 13 are applied to the suction nozzles 12 was described, but in place of the identification codes 13, it is possible to attach a storage medium such as an RF tag to the suction nozzles 12, set an identification code that is stored in the storage medium as a key, and store and manage data such as a number of times of mounting and a cleaning period on the storage medium that is attached to the suction nozzle 12.

More specifically, the component mounting machine 10 performs writing of the number of times of mounting to the storage medium, and the cleaning device 20 performs writing of each flow rate measurement value and cleaning period. Further, when a suction nozzle 12 is attached to the component mounting machine 10 after cleaning, the component mounting machine 10 reads various data such as the identification code, the number of times of mounting, and the cleaning period from the storage medium of the suction nozzle 12. The component mounting machine 10 periodically writes the number of times of mounting to the storage medium of the suction nozzle 12 during production, and when the cleaning period is reached during production, the component mounting machine 10 displays a cleaning instruction of the suction nozzle 12 on an operation screen of the mounting machine control section 15. In addition, a time or a number of board productions until the cleaning period is reached is displayed on the operation screen.

An operator detaches a cleaning target suction nozzle 12 from the component mounting machine 10, and sets the suction nozzle 12 in the cleaning device 20 on the basis of the cleaning instruction. The cleaning device 20 reads various data such as the identification code, the number of times of mounting, and the cleaning period from the storage medium of the suction nozzle 12. After cleaning of the suction nozzle 12, the cleaning device 20 measures the flow rate and writes each flow rate measurement value and calculated subsequent cleaning period to the storage medium of the suction nozzle 12. If such a configuration is used, it is possible to easily perform management of the suction nozzle 12 without the need for management by the host computer 30.

Furthermore, in the abovementioned embodiment, an example in which the identification code 13 is applied to the suction nozzle 12 and reading errors of the identification code 13 are suppressed by cleaning the outer surface of the suction nozzle 12 using the cleaning device 20 was described, but the application of the identification code 13 to the suction nozzle 12 is not an essential requirement for the present embodiment, and the present embodiment may include the identification code 13, or may clean the inner portion of the suction nozzle 12 only.

In this manner, the present embodiment is not limited to the configurations that are mentioned in the abovementioned embodiment, and various forms can be adopted within a range that does not depart from the gist of the embodiment.

INDUSTRIAL APPLICABILITY

The nozzle cleaning period management device and management method according to the present disclosure are suitable for use in component mounting machines that are provided with a plurality of suction nozzles, which perform vacuum retention of an electronic component.

REFERENCE SIGNS LIST

10 . . . component mounting machine, 11 . . . mounting head, 12 . . . suction nozzle, 13 . . . identification code, 15 . . . mounting machine control section, 16 . . . memory, 20 . . . cleaning device, 22 . . . code reading device, 23 . . . measurement device, 25 . . . cleaning control section, 26 . . . memory, 30 . . . host computer, 31 . . . memory, 45 . . . flow rate measurement device (flow rate measurement sensor), Step 104 . . . reduction amount calculation device, Step 204 . . . estimation device, $\Delta Rd$ . . . unit flow rate reduction amount, Rd . . . number of times of mounting of electronic components, Rd0 . . . use limit value flow rate

[FIG. 2]
10: COMPONENT MOUNTING MACHINE
15: MOUNTING MACHINE CONTROL SECTION
16: MEMORY
20: CLEANING DEVICE
26: MEMORY
30: HOST COMPUTER
31: MEMORY

[FIG. 5]
FLOW RATE
RESULT INFORMATION
ESTIMATION
FLOW RATE REDUCTION AMOUNT
NUMBER OF TIMES OF MOUNTING

[FIG. 6]
START
100: READ IDENTIFICATION CODE USING CODE READING DEVICE
102: READ FLOW RATE BEFORE CLEANING Rd1, FLOW RATE AFTER CLEANING Rd2 AND NUMBER OF TIMES OF MOUNTING OF ELECTRONIC COMPONENTS N1 FROM MEMORY
104: DETERMINE UNIT FLOW RATE REDUCTION AMOUNT $\Delta Rd$ USING FOLLOWING FORMULA $$\Delta Rd = (Rd2 - Rd1)/N1$$

106: STORE UNIT FLOW RATE REDUCTION AMOUNT $\Delta Rd$ IN MEMORY FOR EACH IDENTIFICATION CODE
END

Figure 7:
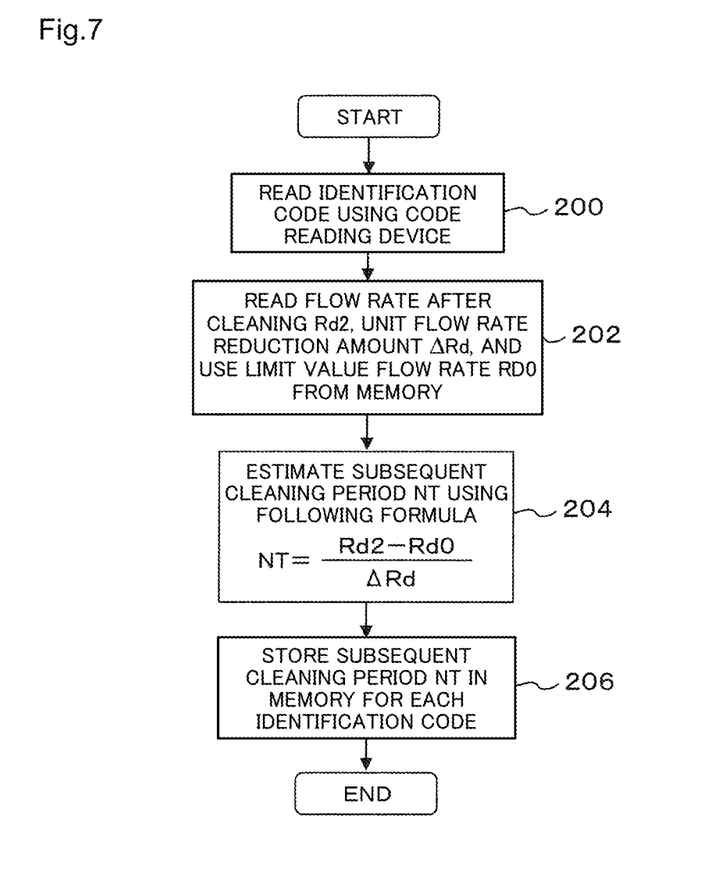
FIG. 7 is a flowchart that shows a sequence that estimates a cleaning period of the suction nozzles.

[FIG. 7]
START
200: READ IDENTIFICATION CODE USING CODE READING DEVICE
202: READ FLOW RATE AFTER CLEANING Rd2, UNIT FLOW RATE REDUCTION AMOUNT $\Delta Rd$, AND USE LIMIT VALUE FLOW RATE RD0 FROM MEMORY
204: ESTIMATE SUBSEQUENT CLEANING PERIOD NT USING FOLLOWING FORMULA $$NT = (Rd2 - Rd0)/\Delta Rd$$

206: STORE SUBSEQUENT CLEANING PERIOD NT IN MEMORY FOR EACH IDENTIFICATION CODE
END

The invention claimed is:
1. A nozzle cleaning period management device comprising:
a cleaning device that cleans suction nozzles that are used in order to perform vacuum retention of an electronic component;

a flow rate measurement device that measures a flow rate that flows through the suction nozzles;

a reduction amount calculation device that calculates a unit flow rate reduction amount of the flow rate of the suction nozzle per a number of times of mounting of electronic components on the basis of a flow rate difference before and after cleaning, which is measured by the flow rate measurement device; and an estimation device that estimates a cleaning period, which subsequently cleans the suction nozzles, on the basis of the unit flow rate reduction amount, which is calculated by the reduction amount calculation device, and a flow rate after cleaning.

2. The nozzle cleaning period management device according to claim 1, wherein the estimation device estimates a subsequent cleaning period by subtracting a use limit value flow rate from a flow rate after cleaning, and dividing a subtracted value by the unit flow rate reduction amount.

3. The nozzle cleaning period management device according to claim 1, wherein an identification code, which is read by a code reading device, is applied to outer surfaces of the suction nozzles, and wherein the cleaning device is configured to also clean the outer surface of the suction nozzles.

4. The nozzle cleaning period management device according to claim 3, wherein the subsequent cleaning period that is estimated by the estimation device is stored for each identification code of the suction nozzles.

5. A nozzle cleaning period management method comprising:

reading an identification code that is applied to suction nozzles;

measuring a flow rate that flows through the suction nozzles before cleaning the suction nozzles;

subsequently cleaning the suction nozzles and measuring a flow rate that flows through the suction nozzles after cleaning;

calculating a unit flow rate reduction amount of the flow rate of the suction nozzle per a number of times of mounting of electronic components on the basis of flow rate differences before and after cleaning; and estimating the cleaning period, which subsequently cleans the suction nozzles, on the basis of the unit flow rate reduction amount and the flow rate after cleaning.

6. The nozzle cleaning period management method according to claim 5, wherein a subsequent cleaning period is estimated by subtracting a use limit value flow rate from a flow rate after cleaning, and dividing a subtracted value by the unit flow rate reduction amount for each identification code of the suction nozzles.

* * * * *